(12) United States Patent
Nakamura

(10) Patent No.: US 8,535,600 B2
(45) Date of Patent: Sep. 17, 2013

(54) HIGH TEMPERATURE-RESISTANT ARTICLE, METHOD FOR PRODUCING THE SAME, AND HIGH TEMPERATURE-RESISTANT ADHESIVE

(75) Inventor: Daisuke Nakamura, Nagoya (JP)

(73) Assignee: Kabushiki Kaisha Toyota Chuo Kenkyusho, Aichi (JP)

( * ) Notice: Subject to any disclaimer, the term of this patent is extended or adjusted under 35 U.S.C. 154(b) by 665 days.

(21) Appl. No.: 12/659,619

(22) Filed: Mar. 15, 2010

(65) Prior Publication Data

US 2010/0239885 A1 Sep. 23, 2010

(30) Foreign Application Priority Data

Mar. 23, 2009 (JP) ................................ 2009-071019

(51) Int. Cl.
*B28B 1/30* (2006.01)

(52) U.S. Cl.
USPC ......................................................... 264/642

(58) Field of Classification Search
USPC ................................................. 264/643, 642
See application file for complete search history.

(56) References Cited

U.S. PATENT DOCUMENTS

| 5,447,549 | A * | 9/1995 | Yoshimura | 75/238 |
| 2002/0162691 | A1 * | 11/2002 | Fang et al. | 175/374 |
| 2007/0105706 | A1 * | 5/2007 | Chen et al. | 501/87 |

FOREIGN PATENT DOCUMENTS

| JP | A-50-80303 | 6/1975 |
| JP | A-55-107751 | 8/1980 |
| JP | A-4-187739 | 7/1992 |
| JP | A-6-87655 | 3/1994 |
| JP | A-6-87656 | 3/1994 |
| JP | A-6-280117 | 10/1994 |
| JP | A-8-64110 | 3/1996 |
| JP | A-10-236892 | 9/1998 |
| JP | A-11-116398 | 4/1999 |
| JP | A-11-116399 | 4/1999 |
| JP | A-2003-300784 | 10/2003 |
| JP | A-2004-84057 | 3/2004 |
| JP | A-2005-68002 | 3/2005 |
| JP | A-2008-169111 | 7/2008 |
| WO | WO 2006/085635 A1 | 8/2006 |

OTHER PUBLICATIONS

Office Action issued in Japanese Patent Application No. 2010-066995 dated Jul. 31, 2012 (with translation).

\* cited by examiner

*Primary Examiner* — Joseph S Del Sole
*Assistant Examiner* — Erin Snelting
(74) *Attorney, Agent, or Firm* — Oliff & Berridge, PLC

(57) ABSTRACT

A method for producing a high temperature-resistant article comprises an assembling step of foaming an assembly of a first substrate and a second substrate with an adhesive layer interposed therebetween and comprising paste of powder of at least one carbide of niobium carbide, hafnium carbide, tantalum carbide and tungsten carbide; and a bonding step of heating the assembly to bond the first substrate and the second substrate by sintering, thereby obtaining a high temperature-resistant article comprising the assembly after sintering. Moreover, a method for producing a high temperature-resistant article comprises a coating step of coating a slurry comprising powder of at least one carbide of niobium carbide, hafnium carbide, tantalum carbide and tungsten carbide on a surface of a high temperature-resistant substrate; a drying step of drying the substrate after the coating step; and a film-forming step of heating the substrate after the drying step to form a carbide coating film on the surface of the substrate by sintering, thereby obtaining a high temperature-resistant article having the carbide coating film. A high temperature-resistant article of a complicated shape can be easily produced at low costs by these methods.

8 Claims, 3 Drawing Sheets

HIGH TEMPERATURE-RESISTANT ARTICLE, METHOD FOR PRODUCING THE SAME, AND HIGH TEMPERATURE-RESISTANT ADHESIVE

TECHNICAL FIELD

The present invention relates to a high temperature-resistant article, a method for producing the same, and a high temperature-resistant adhesive suitable for producing a high temperature-resistant article and the like.

BACKGROUND OF THE INVENTION

Single crystals of silicon carbide (SiC) and so on used, for example, as semiconductor materials are often fabricated by a sublimation-recrystallization method. This method is generally carried out by placing raw material powder such as SiC powder and a seed of single crystal in a manner to face each other in a crucible made of graphite or the like and heating them to a high temperature of 2,000 to 2,400 deg. C. in an inert atmosphere.

If, in this case, the crucible made of graphite or the like is used as it is for growing crystal, carbon may sublime from an inner wall of the crucible and give an adverse effect on single crystal growth. It is possible to use a crucible made of a carbide of a high-melting-point metal such as tantalum carbide instead of graphite. Prior art documents generally relating to such a high-melting-point metal carbide are shown below.

Patent Document 1: Japanese Unexamined Patent Publication No. S55-107,751
Patent Document 2: Japanese Unexamined Patent Publication No. S50-80,303
Patent Document 3: Japanese Unexamined Patent Publication No. H06-87,656
Patent Document 4: Japanese Unexamined Patent Publication No. H04-187,739
Patent Document 5: Japanese Unexamined Patent Publication No. H06-87,655
Patent Document 6: Japanese Unexamined Patent Publication No. H10-236,892
Patent Document 7: WO2006/085635
Patent Document 8: Japanese Unexamined Patent Publication No. H06-280,117
Patent Document 9: Japanese Unexamined Patent Publication No. H11-116,398
Patent Document 10: Japanese Unexamined Patent Publication No. 2008-169,111
Patent Document 11: Japanese Unexamined Patent Publication No. 2005-68,002
Patent Document 12: Japanese Unexamined Patent Publication No. H11-116,399
Patent Document 13: Japanese Unexamined Patent Publication No. 2004-84,057
Patent Document 14: Japanese Unexamined Patent Publication No. H08-64,110

Metal carbides, however, are expensive and their bulk sintered bodies are difficult to be processed. Therefore, it is conventionally difficult to produce high temperature-resistant articles comprising metal carbides at low costs. It is also possible to obtain high temperature-resistant articles of complicated shapes by injection molding metal carbide powder. However, injection molding requires a great amount of binder, and removal or burning out of the binder causes defects such as shape deformation or carbon precipitates.

On the other hand, while using graphite or the like as a substrate, it is possible to coat a high-melting-point metal carbide on a surface of the substrate. For example, this is a method in which a high-melting-point metal is vapor deposited or attached on a graphite substrate and then the high-melting-point metal is carburized by heating, thereby forming a metal carbide coating layer on the graphite substrate.

In such a conventional method, however, the high-melting-point metal increases in volume in being carburized and as a result the coating layer is liable to be peeled off due to compressive stress. The coating layer can be formed by CVD, CVR, AIP, reactive ion plating, or other methods, but production costs by these methods are high. It is also possible to carburize only a surface of a high-melting-point metal substrate, but the high-melting-point metal in itself is expensive and difficult to be processed. Besides, since heat resistance depends on properties of a metal as a base material, heat resistance of the surface-carburized high-melting-point metal cannot be as high as that of a metal carbide as a substrate.

SUMMARY OF THE INVENTION

The present invention has been made in view of these circumstances, and it is an object of the present invention to provide a high temperature-resistant article which is applicable, for example, to a high temperature crucible and a method for producing such a high temperature-resistant article at low costs. It is also an object of the present invention to provide an adhesive capable of bonding a plurality of high temperature-resistant substrates to enable to obtain a high temperature-resistant article of a complicated shape at low costs.

The present inventors have earnestly studied to solve the above problems and, after a lot of trial and error, have succeeded in obtaining a sintered body of tantalum carbide with little shape deformation by sintering a thin plate-like tantalum carbide compact with both sides thereof covered with graphite flat plates. The present inventors have further developed this result and completed a series of invention as follows.

<Method 1 for Producing a High Temperature-Resistant Article>

(1) A method for producing a high temperature-resistant article, comprising: a forming step of forming raw material powder comprising powder of at least one carbide of niobium carbide, hafnium carbide, tantalum carbide and tungsten carbide into a thin plate-like carbide compact; and a sintering step of sintering the carbide compact into a carbide sintered body, thereby obtaining a high temperature-resistant article comprising the carbide sintered body, the sintering step being a step of attaching a shielding member having flat surfaces facing main flat surfaces of the carbide compact and heating the carbide compact with the main flat surfaces shielded with the facing flat surfaces. The sintering step is, for example, a step of heating the carbide compact with the facing flat surfaces of the shielding member contacted with the main flat surfaces of the carbide compact without applying pressure. The shielding member is, for example, a pair of graphite flat plates. Moreover, the forming step is, for example, a step of uniaxially compression molding the raw material powder. Preferably the raw material powder includes additive powder, for example, comprising a transition metal having a melting point of not more than sintering temperature in the sintering step or a carbide of the transition metal.

(2) The high temperature-resistant article according to the present invention comprises a sintered body of a metal carbide (a carbide sintered body) having a very high melting point. Therefore, the high temperature-resistant article in itself has a remarkably good resistance to heat (for example, 2,000 deg. C. or more). This high temperature-resistant article is a sintered body of a compact obtained by forming metal carbide powder in a desired thin plate shape beforehand in the forming step. Since the raw material is not wasted and the amount of the raw material used can be reduced, costs of the high temperature-resistant article can be reduced.

However, if a thin plate-like carbide compact is simply sintered, a component such as carbon is removed from the carbide compact (what is called decarburization) and local uneven distribution of the component is caused in the carbide compact. As a result, the plate-like carbide sintered body is often deformed in shape and roughened in surface, and it is not possible to obtain a carbide sintered body (a bulk carbide flat plate) having good flatness or a desired high temperature-resistant article. It is not preferable to ensure flatness by subsequent processing, because it increases costs. Even if the carbide compact is sintered with carbon powder filled around the carbide compact in order to prevent the abovementioned decarburization (see Patent Document 2), surface of the sintered body gets rough all the same and a carbide sintered body having good flatness cannot be obtained. It should be noted that as used in the present invention, the term "flatness" arbitrarily refers not only to smooth surface texture of a flat plate but also lack of deformation of the flat plate in itself.

Unlike these conventional methods, the method of the present invention carries out a sintering step with the main flat surfaces of the carbide compact shielded with the facing flat surfaces of the shielding member which is provided in contact with or in close proximity to (i.e., attached to) the carbide compact. Therefore, during heating for sintering, the facing flat surfaces of the shielding member suppress removable of components of the carbide compact from the main flat surfaces of the carbide compact and as a result a carbide sintered body or a high temperature-resistant article having good flatness can be obtained. The present invention makes it possible to obtain a carbide sintered body or a high temperature-resistant article having good flatness relatively easily while reducing not only raw material costs but also production processing costs.

(3) The term "thin plate-like" mentioned in the present invention means a plate shape having a small thickness when compared to the total area to such an extent that a carbide sintered body obtained by using a reduced amount of carbide powder causes a problem in flatness. Although it is difficult to express the degree of thinness quantitatively, for example the thinness is about 0.3 to 3 mm in a case of a carbide sintered body and about 0.4 to 4 mm in a case of a carbide compact. "Main flat surfaces" of a carbide compact are surfaces having a remarkably larger area of all constituent surfaces of the thin flat plate-shaped compact and generally both a top surface and a bottom surface. However, the main flat surfaces of the present invention have an importance in their flatness (surface roughness and the degree of flatness) and parallelism between these two surfaces is not strictly demanded.

It is preferable that the facing flat surfaces of the shielding member which are to face these main flat surfaces have good flatness as well as the main flat surfaces. Although which of the main flat surfaces and the facing flat surfaces are larger in area does not matter, it is preferable that the entire main flat surfaces are covered with the facing flat surfaces in view of suppressing shape deformation of the carbide sintered body. It is possible to prepare two separate shielding members and shield both of the main flat surfaces of the carbide compact with an facing flat surface of each of the separate shielding members. It is also possible to use one shielding member having two facing flat surfaces which are to sandwich both of the main flat surfaces of the thin plate-like carbide compact.

<Method 2 for Producing a High Temperature-Resistant Article>

(1) The present invention can also be grasped as a method for producing a high temperature-resistant article, comprising: an assembling step of forming an assembly of a first substrate and a second substrate with an adhesive layer interposed therebetween and comprising paste of powder of at least one carbide of niobium carbide, hafnium carbide, tantalum carbide and tungsten carbide; and a bonding step of heating the assembly to bond the first substrate and the second substrate by sintering, thereby obtaining a high temperature-resistant article comprising the assembly after sintering.

(2) According to this aspect of the present invention, high temperature-resistant substrates are combined together by using paste of a metal carbide and then the assembly is heated, whereby the substrates are bonded together by sintering by the adhesive layer formed of the paste. Owing to this, even a high temperature-resistant article of a complicated shape can be easily produced at relatively low costs. In addition, there will be no defects caused by removal of a binder, unlike in a case of injection molding. Furthermore, cutting work after initial sintering can be omitted and there will be no cutting debris, and therefore expensive metal carbide can be used effectively.

(3) It should be noted that "an assembly" mentioned in the present invention is not limited to an assembly of two members comprising a first substrate and a second substrate, and can be an assembly of three or more substrates to be bonded together upon sintering. In such a case, the respective substrates of the assembly can be carbide compacts or carbide sintered bodies having a main component of a similar kind to that of paste (an adhesive), or can be high temperature-resistant substrates comprising graphite, silicon carbide (SiC), boron nitride (BN), aluminum nitride (AlN), tungsten (W), or the like. When substrates of the same kind are bonded together, it is preferable to use paste in which a carbide of the same kind is used as a base material. When substrates of different kinds are bonded together, it is preferable to appropriately select paste which uses a carbide chemically stable to both the substrates as a base material.

When carbide compacts are combined together, it is efficient that the bonding step of the present invention also serves as a step of sintering the compacts. Even when carbide sintered bodies are combined together, since a thin plate-like carbide sintered body having good flatness can be easily obtained according to the abovementioned aspect of the present invention, a high temperature-resistant article of a complicated shape with a small thickness and little shape deformation can be obtained relatively easily at low costs. When a container is constituted by an assembly, it is possible to combine flat plate-shaped substrates together but also possible to combine a tubular substrate and a flat plate-like substrate. The tubular substrate or the like can be produced relatively easily by using a centrifugal forming method or the like.

<Method 3 for Producing a High Temperature-Resistant Article>

(1) The present invention can also be grasped as a method for producing a high temperature-resistant article, comprising: a coating step of coating a slurry comprising powder of at least one carbide of niobium carbide, hafnium carbide, tantalum carbide and tungsten carbide on a surface of a high temperature-resistant substrate; a drying step of drying the high temperature-resistant substrate after the coating step; and a film-foaming step of heating the high temperature-resistant substrate after the drying step to form a carbide coating film on the surface of the high temperature-resistant substrate by sintering, thereby obtaining a high temperature-resistant article having the carbide coating film.

(2) According to this aspect of the present invention, a high temperature-resistant article can be obtained at low costs by forming a metal carbide coating film on a surface of the substrate, while using a relatively inexpensive high temperature substrate. In addition, because fundamentally a slurry of a metal carbide is simply coated, dried and sintered, this method has a high degree of freedom in meeting a variety of shapes of high temperature-resistant substrates. Therefore, a high temperature-resistant article of a complicated shape can be obtained easily.

(3) The high temperature-resistant substrate mentioned in the present invention can be formed of a metal carbide, but it is preferable in view of costs that the substrate is formed of a different material from a metal carbide of a slurry such as graphite and boron nitride. Although heat resistance of high temperature-resistant substrates differs depending on the kind of the substrate materials, preferably the substrate has a melting point of not less than 2,000 deg. C.

<High Temperature-Resistant Article>

The present invention can be grasped not only as the abovementioned methods, but also as high temperature-resistant articles produced by the methods.

<High Temperature-Resistant Adhesive>

Furthermore, the present invention can also be grasped as a high temperature-resistant adhesive comprising paste of powder of at least one carbide of niobium carbide, hafnium carbide, tantalum carbide and tungsten carbide, which are used in forming an assembly of substrates.

<Remarks>

(1) A range "x to y" mentioned in the present invention includes both a lower limit value x and an upper limit value y, unless otherwise specified. Moreover, a new range "a to b" can be defined by arbitrarily combining lower limits and upper limits mentioned in the present invention.

(2) The raw material powder, the paste, the adhesive and the like in the present invention can suitably include "a reforming element". The reforming element is an element effective for improving characteristics of the high temperature-resistant article or the adhesive. A typical example of the reforming element is a transition metal or a carbide thereof mentioned in the present invention, and other examples of the reforming element include a transition metal boride and a transition metal nitride. The characteristics to be improved are not limited in kind. A plurality of reforming elements can be combined arbitrarily and the content of the respective reforming elements are generally very small. It is needless to say that the raw material powder, the paste, the adhesive and the like in the present invention can contain inevitable impurities, that is, impurity elements which are contained in a raw material or added in any of the steps and are difficult to be removed in view of costs or technical reasons.

BRIEF DESCRIPTION OF THE DRAWINGS

The exact nature of the present invention, as well as other objects and advantages thereof, will be readily apparent from consideration of the following specification relating to the accompanying drawings, in which.

DETAILED DESCRIPTION OF THE PREFERRED EMBODIMENTS

Figure 1:
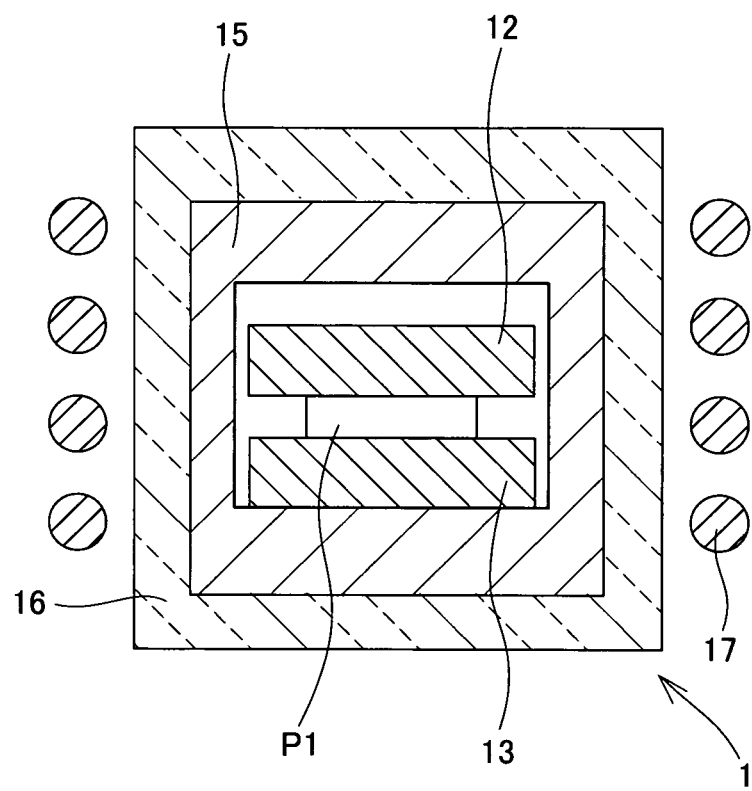
FIG. 1 is a schematic explanatory diagram illustrating a step of sintering a flat plate-shaped tantalum carbide compact according to Example 1 of the present invention.

The present invention will be described in more detail by way of preferred embodiments. Description of the present invention including the following description of the preferred embodiments is applicable not only to the method for producing a high temperature-resistant article according to the present invention but also to the high temperature-resistant article, the high temperature-resistant adhesive and the like according to the present invention. In the present invention, the abovementioned constituent features can be added with one or more selected arbitrarily from the constituent features described below. Any of the following constituent features can be added arbitrarily and in a multiple way beyond category. Which embodiment is best depends on an intended application, required performance and so on.

<Raw Material Powder>

Raw material powders of a carbide compact, a carbide sintered body, paste of a high temperature-resistant adhesive, a slurry to become a carbide coating film and so on according to the present invention appropriately include not only carbide powder as a main component but also additive powder, an organic binder, a plasticizer, a solvent and so on.

(Carbide Powder)

(1) Carbide powder mentioned in the present invention comprises at least one of niobium carbide, hafnium carbide, tantalum carbide and tungsten carbide. Each of these carbides has a very high melting point. These carbides can be expressed in chemical formulae as $NbC$, $Nb_2C$, $HfC$, $Hf_2C$, $TaC$, $Ta_2C$, $WC$, $W_2C$, and so on, respectively and any of these carbide can be employed in the present invention. The carbide powder used in the present invention can be a single kind of powder comprising any one of the abovementioned carbide powers or a mixed powder of plural kinds of the carbide powders. Since tantalum carbide has the highest melting point, it is preferable to use only tantalum carbide powder or powder containing tantalum carbide powder as a main component (containing more than 50 mass %, preferably not less than 90 mass % and more preferably not less than 95 mass % of tantalum carbide power based on the total mass of the raw material powder).

(2) Preferably the raw material powder has an average particle diameter of 0.2 to 5 μm. When the average particle diameter is excessively small, the amount of sintering shrinkage increases and shape deformation of a carbide sintered body is liable to occur. On the other hand, when the average particle diameter is excessively large, a carbide sintered body cannot be densified. The upper limit or the lower limit of the average particle diameter can be selected arbitrarily within the above numerical value range. However, it is particularly preferable that 1 μm and 3 μm are defined as an upper limit and a lower limit, respectively.

(Additive Powder)

(1) The additive powder mentioned in the present invention comprises a transition metal having a melting point of not more than sintering temperature of the carbide sintered body or the like or a carbide of the transition metal. Upon melting of this additive powder during sintering, the carbide sintered body can be densified, and the carbide adhesive layer or the carbide coating film can be stabilized and homogenized. For example, the density of a carbide sintered body in a case of using the additive powder is not less than 90% of its theoretical density.

It is preferable to employ titanium (Ti), chromium (Cr), iron (Fe), cobalt (Co), nickel (Ni) or the like as a transition metal for such additive powder, because these metals melt in a temperature range of 1,400 to 1,700 deg. C. at which sintering starts, and sublime during sintering (at a maximum sintering temperature) to leave nothing behind as impurities. Specifically, it is preferable to employ a transition metal having a boiling point of 2,600 to 3,300 deg. C. as additive powder. As the carbide of the transition metal used for the additive powder, it is preferably to employ TiC, $Cr_{25}C_6$, $Fe_3C$, $Co_2C$, $Ni_2C$, and so on because these carbides are easily available.

(2) Preferably the additive powder has an average particle diameter of 0.2 to 5 μm. When the average particle diameter is excessively small or excessively large, the carbide sintered body, the adhesive layer or the carbide coating film tends to lack in uniformity. In particular, the carbide sintered body cannot be densified and tends to be deformed in shape. Preferably the additive powder is contained in an amount of 0.01 to 3 atomic % based on the total number of atoms in the sum of the carbide powder and the additive powder. This is because when the content of the additive powder is excessively small, the additive powder cannot give much effect, while when the content of the additive powder is excessively great, the additive powder becomes residual impurities other than the metal carbide. The upper limit or the lower limit of the content of the additive powder can be arbitrarily selected and defined within the above numerical value range. However, it is particularly preferable that 0.5 at. % and 2 at. % are defined as an upper limit and a lower limit, respectively.

(Organic Binder)

The organic binder increases formability of the carbide compact and facilitates handling of the carbide compact. When used for paste for the high temperature-resistant adhesive or a slurry for forming a carbide coating film, the organic binder facilitates adjustment of adherence and viscosity and thereby improves coating properties. Furthermore, the organic binder is also effective in ensuring adherence in a relatively low temperature range. Examples of such an organic binder include polyvinyl alcohol (PVA), polyvinyl butyral (PVB), methyl cellulose, ethyl cellulose, acetyl cellulose, phenolic resin, urea resin and melamine resin, and any suitable binder can be selected in accordance with an intended use.

It is preferable that, in forming a carbide compact, the organic binder is contained in an amount of 0.2 to 2 mass % in terms of the sum of the organic binder and the organic binder plasticizer with respect to the total mass of the raw material powder. When the content of the organic binder is excessively small, the organic binder cannot exhibit the aforementioned effect sufficiently. On the other hand, when the content of the organic binder is excessively great, the carbon sintered body tends to have defects such as shape deformation and carbon precipitates.

It is preferable that, in preparing paste for the high temperature-resistant adhesive or a slurry for forming a carbide coating film, the organic binder is contained in an amount of 0.1 to 5 mass % with respect to the total mass of the paste or the slurry. In this case, the solvent is preferably contained in an amount of 1 to 20 mass %. Examples of the solvent include ethanol and α-terpineol. An example of the plasticizer is dibutyl phtalate, but the plasticizer can be appropriately selected in accordance with the kind of the organic binder.

<<Forming Step>>

The forming step of the present invention is a step of forming raw material powder into a thin plate-like carbide compact. The forming method is not particularly limited, but preferably the forming step is a step of uniaxially compression molding raw material powder. This is because a carbide compact is obtained at low costs and the amount of the organic binder can be small and as a result defects such as shape deformation and carbon precipitates can be reduced. In such a case, preferably forming pressure is 20 to 100 MPa. This is because when the forming pressure is excessively low, the compact will have a small density and be difficult to be handled, while when the forming pressure is excessively high, the compact will stick to a mold and be easily destroyed. The forming pressure is more preferably 30 to 60 MPa.

The carbide compact according to the present invention has a thin flat plate-like shape, but can be shaped of a disk, a polygonal plate, a flat plate with one or more holes, or the like. A carbide compact of a desired shape can sometimes be obtained by one forming operation, and sometimes be obtained by drilling one or more holes in a plate-shaped compact obtained by pressure forming. Processing of a carbide compact before heating is relatively easy. It should be noted that waste generated in steps before sintering can be reused and therefore material costs can be reduced.

<<Sintering Step>>

The sintering step is a step of sintering the carbide compact at a desired sintering temperature into a carbide sintered body. The sintering step of the present invention is carried out with flat surfaces of a shielding member facing main flat surfaces of the carbide compact.

(1) Shielding Member

The shielding member can be constituted by a single component or a plurality of separate components, as long as it has facing flat surface capable of shielding both the main flat surfaces of the carbide compact. The material, shape or the like of the shielding member is not particularly limited, as long as it can suppress decarburization and so on during sintering. Preferably the shielding member is made of graphite (for example, graphite flat plates) because flat facing surfaces can be relatively easily produced at low costs and it can be a source of carbon. Moreover, it is also preferable that the respective facing flat surfaces (particularly the facing flat surfaces formed of a graphite material) of the shielding member to be disposed on both sides of the carbide compact are equal to each other in terms of density, thermal expansion coefficient, impurity concentration, composition and the like, because deformation of the carbide sintered body can be suppressed. In addition to the above, bulk carbide flat plates can be used as the shielding member.

The shielding member is preferably placed with respect to the carbide compact in such a manner that during sintering, the shielding member and the carbide compact are not bonded with each other by sintering and that the shielding member can suppress removal of components from the carbide compact. As long as they satisfy these conditions, the shielding member and the carbide compact can have a gap of about not more than 1 mm, not more than 0.5 mm or not more than 0.1 mm. Of course, the main flat surfaces of the carbide compact and the facing flat surfaces of the shielding member can be contacted with each other. Load acting on contact surfaces of the main flat surfaces and the facing flat surfaces is preferably no load or such a small load that the main flat surfaces and the facing surfaces are not bonded to each other by sintering. Preferably, the load is, for example, about the own weight of the shielding member or less. Preferably the sintering step is a step of heating the carbide compact with the facing flat surfaces of the shielding member contacted with the main flat surfaces of the carbide compact without applying pressure.

(2) Sintering Conditions

Preferred sintering conditions applicable to all cases cannot be defined, because the sintering conditions are affected by components of the raw material powder, shape and size of the carbide sintered body, a sintering furnace and so on. However, generally speaking, preferred sintering conditions are in the following range: Sintering temperature is preferably 2,000 to 2,800 deg. C. When the sintering temperature is excessively low, the carbide sintered body cannot be densified. On the other hand, when the sintering temperature is excessively high, grain growth of carbide powder proceeds excessively and as a result the carbide sintered body tends to undergo shape deformation (warpage), cracking, breakage and so on. The sintering temperature is more preferably 2,300 to 2,700 deg. C. Sintering time is about 0.5 to 3 hours, although it depends on sintering temperature and the size of the carbide compact. Sintering atmosphere is preferably a vacuum atmosphere or an inert gas atmosphere. Examples of the inert gas atmosphere include an atmosphere of argon gas, hydrogen gas, nitrogen gas, helium gas, neon gas, xenon gas and a gaseous mixture thereof. In such a case, sintering atmospheric pressure is preferably 1 to 95 kPa. These preferred sintering conditions are also applicable to the bonding step using a high temperature-resistant adhesive or the step of forming a carbide coating film to be discussed below.

<<High Temperature-Resistant Adhesive>>

The high temperature-resistant adhesive comprises paste of the aforementioned carbide powder. The paste is appropriately added with additive power comprising a transition metal or a carbide of the transition metal, and an organic binder, and diluted with an (organic) solvent so as to facilitate formation of an adhesive layer. The high temperature-resistant adhesive only needs to allow easy assembling of a plurality of high temperature-resistant substrates (for example, carbide sintered bodies) and easy bonding of these substrates by sintering. Coating of the adhesive can be carried out, for example, by brush coating or knife coating.

<<Carbide Coating Film>>

The carbide coating film is formed by applying a slurry of the carbide powder on a high temperature-resistant substrate, and drying and sintering (or firing) the slurry. This slurry as well as the abovementioned paste appropriately contains additive powder and an organic binder and is diluted with a solvent. Preferably this slurry has such viscosity as to enable easy formation of a quite even and uniform coating film. Concrete examples of the method of coating the slurry include brush coating, spray coating, and immersion coating, but it is preferable to employ spin coating because it can form a thin uniform coating film. Spin coating is a coating method of pouring a slurry on a surface of a spinning high temperature-resistant substrate and spreading the slurry on the surface of the substrate thinly and evenly by centrifugal force.

In order to improve flatness of a carbide sintered body, it is possible to further form a carbide coating film on a surface of the carbide sintered body. Generally, however, it is advantageous in view of costs to form a carbide coating film on a surface of a substrate comprising a material different from a carbide sintered body. The substrate of a different material is preferably a graphite substrate, a boron nitride substrate and so on in view of ensuring adherence of the carbide coating film while ensuring high temperature resistance of a resultant high temperature-resistant article. In this case, the carbide coating film preferably has a thickness of 5 to 30 µm, 10 to 25 µm, and more preferably 15 to 25 µm. When the thickness is excessively small, the effect of the carbide coating film to improve high temperature resistance cannot be obtained. On the other hand, when the thickness is excessively great, the carbide coating film tends to develop cracks.

If there is need to form a thick coating layer (coating film) of a carbide (especially tantalum carbide) on a surface of a high temperature-resistant substrate for an intended use, it is preferable to employ a high temperature-resistant substrate having a thermal expansion coefficient close to that of tantalum carbide. For example, when a graphite substrate is used as a high temperature-resistant substrate, it is preferable to use a graphite substrate having a relatively high thermal expansion coefficient of about 5.5 to $8.5 \times 10^{-6}$/K (measured at about room temperature to 500 deg. C.) instead of a general graphite substrate having a thermal expansion coefficient of about 3.5 to $5.5 \times 10^{-6}$/K (measured at about room temperature to 500 deg. C.). In such a case, the difference in thermal expansion coefficient between a carbide coating film formed by coating a tantalum carbide slurry mainly comprising tantalum carbide and the graphite substrate can be small and therefore a crack-free thick carbide coating film of, for example, about not less than 30 µm can be formed. However, if the thickness of the carbide coating film exceeds 200 µm, flatness of a surface of the carbide coating film tends to be deteriorated. Therefore, even when such a graphite substrate as mentioned above is used, the carbide coating film formed on a surface of the substrate and having tantalum carbide as a main component preferably has a thickness of 30 to 200 µm and more preferably 30 to 100 µm.

<<High Temperature-Resistant Article>>

The high temperature-resistant article according to the present invention is applicable, for example, to a high temperature crucible, a high temperature heater, a high temperature filament, a susceptor for chemical vapor deposition (CVD), or their constitutional components. The high temperature-resistant article according to the present invention is applicable not only to a substrate in itself comprising metal carbide, but also to an article in which a carbide coating film is formed only on a surface of a substrate of a different material and an article comprising a plurality of high temperature-resistant substrates bonded together by sintering with a high temperature-resistant adhesive. The high temperature-resistant article of the present invention is resistant to activity as well as high temperature. Specifically speaking, the high temperature-resistant article of the present invention is difficult to be modified by molten metal, atmospheric gas, or sublimation gas. Therefore, the high temperature-resistant article of the present invention allows high reproducibility of high-temperature heat treatment or crystal growth (for example, crystal growth of SiC, GaN, AlN and so on), and can repeatedly be used under such an environment. This is economically advantageous.

EXAMPLES

The present invention will be described more specifically by way of examples.

Example 1

Production of Tantalum Carbide Flat Plates

<Production of Specimens>

(1) Raw materials prepared were TaC powder (purity: 99.9%) as carbide powder, Co powder as additive powder (average particle diameter: 5 µm), polyvinyl butyral (PVB) as an organic binder, dibutyl phthalate as a plasticizer, and ethanol as an organic solvent. TaC powder having an average particle diameter of 2 μm was used basically, but TaC powders having average particle diameters of 0.1 μm and 10 μm respectively were also prepared to evaluate effect of particle diameter of the carbide powder. The respective amounts of the raw materials mixed shown in Table 1 are expressed in mass % or atomic % in the entire TaC powder before forming. These raw materials were weighed and mixed as shown in Table 1, thereby preparing raw material powders of specimen Nos. 1 to 18. Specifically, the respective raw material powders were mixed by a mixer and then dried and pulverized, thereby obtaining mixed powders.

(2) Using the various kinds of mixed powders, thin disk-shaped tantalum carbide flat plates (carbide sintered bodies) having a diameter of 80 mm and a thickness of 0.8 mm were produced. Compacts before sintering were obtained by uniaxially compression molding each of the mixed powders under forming pressure of 50 MPa (a forming step). In the compact of specimen No. 5, a through hole having a diameter of 30 mm was formed with a utility knife at a center of the disk before sintering. These compacts were sintered at respective sintering temperatures of 1,900 to 2,900 deg. C. as shown in Table 1. Sintering atmosphere was argon atmosphere (80 kPa) and sintering time (holding time at a maximum sintering temperature) was one hour. For heating, a high frequency heating furnace 1 as shown in FIG. 1 was used (a sintering step). The high frequency heating furnace 1 comprises a graphite crucible 15, a heat insulator 16 which surrounds the graphite crucible 15 and further a high frequency heating coil 17 placed around the outer circumferential of the heat insulator 16.

In this sintering step, graphite flat plates 12 and 13 (shielding members) were respectively placed on an upper surface and a lower surface of each tantalum carbide flat plate P1 (each compact). That is to say, main flat surfaces (circular flat surfaces having a diameter of 100 mm) of each tantalum carbide flat plate P1 were shielded with facing flat plates of the graphite plates 12 and 13 in order to prevent decarburization of the main flat surfaces. No load other than the own weight of the graphite flat plates 12 and 13 or tantalum carbide flat plates P1 was applied between the graphite flat plates 12, 13 and the tantalum carbide flat plate P1. A schematic diagram illustrating this sintering step is shown in FIG. 1. As indicated by specimen Nos. 2 to 4 in Table 1, a specimen without an upper graphite plate, and specimens with either or both of the graphite flat plates replaced with graphite powder were also produced.

<Measurement>

The respective obtained specimen Nos. 1 to 18 were observed and examined about formability and sintering behavior, and results are shown in Table 2. Formability was examined by checking with the naked eye whether each carbide compact developed cracks or not. Shape retainability of sintered bodies (whether they were warped or not) was evaluated by curvature radius. This curvature radius was measured by a contact type height gauge. It should be noted that a sintered body which developed cracks is marked with "X" without measuring curvature radius.

Density of each sintered body was measured by Archimedes' method and evaluated in terms of relative density. Ideal density (theoretical density) used as a standard was density of 100% pure tantalum carbide with an assumption that all the additive disappeared. Roughness of the main flat surfaces of each tantalum carbide flat plate was observed with the naked eye. Moreover, the amount of metals other than Ta contained in each sintered body (concentration of impurities) was measured by X-ray fluorescence analysis.

<Evaluation>

(1) Comparison of specimen Nos. 1 to 4 showed that carbide sintered bodies which showed little warpage, that is, had good shape retainability could be obtained by placing graphite flat plates on both upper and lower surfaces of each carbide compact. This is supposed to be because the amount of carbon removed from the carbide compact and the amount of carbon supplied from the graphite flat plates were approximately equal between the main flat surfaces of the carbide compact and the facing flat surfaces of the graphite flat plates. That is to say, this is supposed to be because sintered behavior was equal between the main flat surfaces and the facing flat surfaces. As apparent from specimen No. 5, the same holds true for the carbide compact which was processed before sintering.

(2) Comparison of specimen Nos. 1, 6, and 7 showed that when the carbide powder had an excessively small diameter, sintering shrinkage proceeded excessively and a sintered body tended to be warped, while when the carbide powder had an excessively large diameter, a sintered body did not increase in density and was difficult to be densified.

(3) Comparison of specimen Nos. 1, 8 and 9 showed that addition of the sintering additive helped the carbide sintered bodies to be densified. However, when the concentration of the sintering additive was too high, the additive other than the high-melting-point metal (Ta) tended to remain as an impurity element.

(4) Comparison of Specimen Nos. 1 and 10 to 14 showed that addition of appropriate amounts of the organic binder and the plasticizer improved formability of the carbide compacts. When the amounts were excessively small or large, formability deteriorated and the compacts were difficult to be handled. Besides, as the amount of the organic binder increased, the carbide sintered bodies tended to be warped greatly and were difficult to be densified.

(5) Comparison of Specimen Nos. 1 and 15 to 18 showed that higher sintering temperature is not preferable because as the sintering temperature increased, the sintered bodies tended to be more warped, although the sintered bodies were more easily densified. Therefore it is apparent that sintering temperature in a range of 2,000 to 2,800 deg. C. is preferable. All the foregoing evaluations showed that specimen No. 8 was very good in both formability and sintering behavior.

Example 2

Production of High Temperature-Resistant Articles

<Production of Specimen>

Figure 2A:
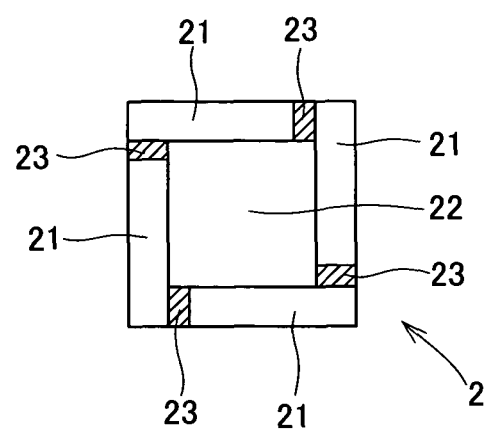
FIGS. 2A and 2B are respectively a top view and a side view of a rectangular cuboidal assembly for a high temperature crucible according to Example 2 of the present invention.
Figure 2B:
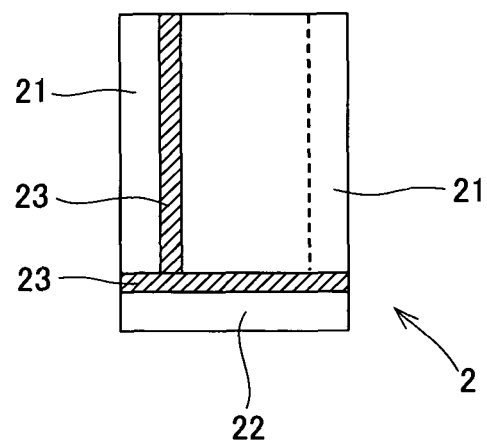

As shown in FIGS. 2A and 2B, an open-topped rectangular cuboidal container 2 (a high temperature crucible) was produced as by bonding tantalum carbide flat plates 21 and 22 with an adhesive comprising paste of TaC powder. First, four rectangular tantalum carbide flat plates 21 (30 mm W×50 mm H×0.8 mm T) for sides and one square tantalum carbide flat plate 22 (32 mm W×32 mm H×0.8 mm T) for a bottom were prepared under the same conditions as those of specimen No. 1 of Example 1 shown in Tables 1 and 2.

Next, as the adhesive, a paste was prepared by mixing and kneading the abovementioned TaC powder (average particle diameter: 2 μm), organic binders (ethyl cellulose or PVB) and organic solvents (α-terpineol and ethanol) at a ratio of 80 mass % of TaC, 3 mass % of the organic binders and 17 mass % of the organic solvents. Using this adhesive, the tantalum carbide flat plates 21, 22 as substrates were assembled as shown in FIGS. 2A and 2B (an assembling step). The adhesive coated between the tantalum carbide flat plates had a thickness of about 10 μm. The adhesive was coated with a knife. The adhesive portions 23 as shown in FIGS. 2A and 2B were formed by the adhesive.

The assemble (the carbide assemble) thus obtained was dried by being held in an atmospheric air at 200 deg. C. by using an electric hot plate (a drying step). Then the assemble was placed in a high frequency heating furnace 1 shown in FIG. 1 and sintered under the following conditions: sintering temperature: 2,500 deg. C., sintering atmosphere: argon atmosphere (50 kPa), sintering time (holding time at a maximum sintering temperature): one hour (a bonding step).

<Evaluation>

A high temperature-resistant article (a high temperature crucible) in which the respective tantalum carbide flat plates were firmly and densely bonded together was thus obtained. When the adhesive layer had a thickness of about 10 μm as mentioned above, no cracks were observed. However, when the thickness of the adhesive layer exceeded 30 μm, joint portions after sintering developed a number of cracks which were visible to the naked eye.

<Assemble of a Different Shape>

Figure 3A:
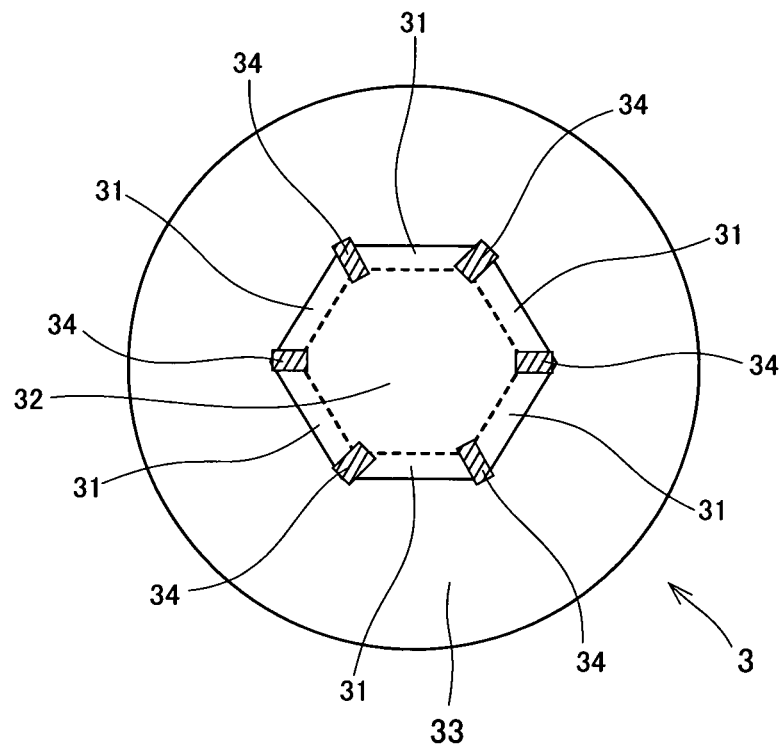
FIGS. 3A and 3B are respectively a top view and a side view of a hexagonal cylinder-shaped assembly for a high temperature crucible according to Example 2 of the present invention.
Figure 3B:
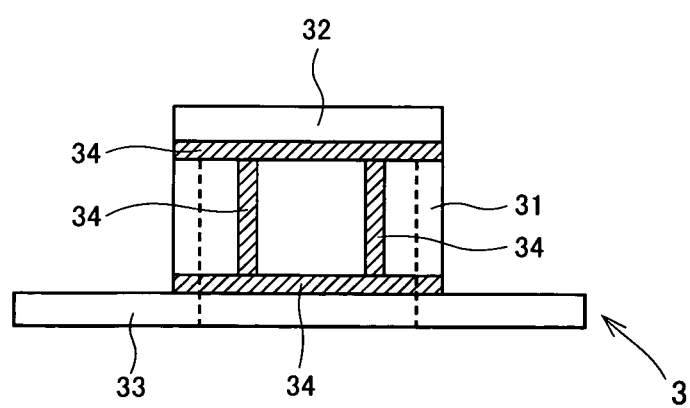

As an assemble of a different shape, a hexagonal cylinder-shaped high temperature crucible 3 as shown in FIGS. 3A and 3B was produced. First, six rectangular tantalum carbide flat plates 31 (18.2 mm W×10 mm H×0.8 mm T) (for sides of a seat) and one regular hexagonal tantalum carbide flat plate 32 (18.2 mm in each side length×0.8 mm in thickness) (for a top surface of the seat) were produced under the same conditions as those of specimen No. 1 of Example 1 shown in Tables 1 and 2. One tantalum carbide disk 33 having a through hole (80 mm in outer diameter×30 mm in inner diameter×0.8 mm in thickness) (for a bottom surface of the seat) was also produced under the same conditions as those of specimen No. 5 of Example 1. Next, these plates were assembled in a hexagonal cylinder shape. Strength of each joint portion 34 was as high as those of the tantalum carbide flat plates 31 in themselves. In both cases, it was confirmed that the respective carbide sintered bodies were firmly bonded together by the adhesive of this example of the present invention. In addition, flatness of the tantalum carbide flat plates 31 was also ensured and the assemblies after sintering showed no warpage.

Example 3

Production of High Temperature-Resistant Articles

<Production of Specimens>

Bonding of substrates other than those mentioned in Example 2 will be described below. (1) As substrates to be assembled and bonded together by sintering, graphite plates, SiC single crystal plates, AlN single crystal plates, TaC plates (specimen No. 1 of Example 1), pyrolytic BN plates (bulk BN plates produced by CVD), and W rolled plates were prepared. Each substrate had a disk shape of 10 mm in diameter, and surfaces to be bonded together were lapped in order to attain an anchor effect.

Next, the abovementioned TaC powder and/or WC powder, Co or Fe as additive powder, phenol resin as an organic binder, and methanol as an organic solvent were prepared and kneaded by a mixer, thereby obtaining pastes for adhesives. The carbide powders used were of three kinds; 100 atomic % TaC powder, 100 atomic % WC powder and a mixture of 50 atomic % TaC powder and 50 atomic % WC powder. These carbide powders had an average particle diameter of 2 to 5 μm. The additive powder was added in an amount of 1 atomic % with respect to the total numbers of atoms in each of the carbide powders. The organic binder was added in an amount of about 3 mass % with respect to the total number of atoms in each of the carbide powders. Specific composition of the respective adhesives is as follows. The adhesive using TaC powder comprised 81 mass % of TaC, 2.6 mass % of the organic binder, 0.5 mass % of Co, and 15.9 mass % of the organic solvent. The adhesive using the mixture of TaC and WC powders comprised 81 mass % of TaC+WC, 2.6 mass % of the organic binder, 0.5 mass % of Co, and 15.9 mass % of the organic solvent. The adhesive using WC powder comprised 81 mass % of WC, 2.6 mass % of the organic binder, 0.5 mass % of Co, and 15.9 mass % of the organic solvent.

(2) Using these adhesives, each pair of substrates were appropriately bonded together (an assembling step). The adhesive coated between the substrates had a thickness of about 10 to 20 μm. The adhesive was coated with a knife. The thus obtained assemblies with the adhesives were held in the air at 200 deg. C. by using a hot plate, thereby hardening the adhesives (a hardening step).

Then, two kinds of high temperature treatments were further applied to the assemblies with the hardened adhesives; (i) a first treatment of increasing temperature of the assemblies from room temperature to 1,700 deg. C. and then slowly cooling the assemblies in an argon atmosphere (50 kPa) and (ii) a second treatment of increasing temperature of the assemblies from room temperature to 2,100 deg. C. and then slowly cooling the assemblies in an argon atmosphere (50 kPa). These high temperature treatments also served to sinter the adhesives.

<Measurement>

A tensile test was performed on the assemblies after the above high temperature treatments. Test results of these assemblies (specimen Nos. A1 to A16) are shown in Table 3, in which a tensile strength of 0.1 kgf/cm$^2$ or more was judged as satisfactory adherence (good), a tensile strength of less than 0.1 kgf/cm$^2$ was judged as insufficient adherence (fair), and the substrates which were not bonded together was judged as non-adherence (not good). Tensile test results of substrates bonded with commercially available adhesives (Specimen Nos. B1 to B16) instead of the abovementioned adhesives comprising carbide powders are also shown in Table 3.

<Evaluation>

As apparent from the results shown in Table 3, the adhesives using the carbide powders were capable of bonding a variety of high temperature-resistant articles together. Especially, the adhesives using the carbide powders were confirmed to be usable in a temperature range of not less than 2,000 deg. C., in which conventional commercially available adhesives were not usable.

This is assumed to be because the carbide powders as main components of the adhesives are very stable even in a high temperature range. It is highly important that joint portions of each assembly were not damaged (that is, maintained good bonding strength) over the whole wide temperature range (from room temperature to not less than 2,000 deg. C.). In cases of the adhesives comprising the carbide powders, in a low temperature range of not more than 500 deg. C., the bond is assumed to have been maintained by the organic binder. In an intermediate temperature range of 500 to 1500 deg. C., the bond is assumed to have been maintained by non-graphitizable carbon (amorphous carbon) which was generated by decomposition of the organic binder. In a high temperature range of 1,500 deg. C. or more, the bond is assumed to have been maintained by sintering of the high-melting-point carbide as a main component (and at the same time, the non-graphitizable carbon is assumed to have been absorbed by the high-melting-point metal carbide and have disappeared). In cases of conventional ceramic adhesives, the joint portions were often damaged in a high temperature range of not less than 1,700 deg. C., because the adhesives (main components and organic/inorganic binders) and substrates react with each other.

Example 4

Formation of Carbide Coating Films

<Production of Specimens>

(1) High temperature-resistant articles in which a carbide coating film comprising carbide powder was formed on a surface of each high temperature-resistant substrate will be described below. As high temperature-resistant substrates, graphite substrates and an pyrolytic BN substrate (PBN) were prepared. A slurry to be applied on these substrates was prepared as follows.

The abovementioned TaC powder (average particle diameter: 1 to 2 μm), Co as additive powder, an organic binder (ethyl cellulose or PVB), and an organic solvent (α-terpineol and ethanol) were prepared. When the additive powder was added, the amount of the additive powder was 1 atomic % with respect to the total number of atoms in the TaC powder. The amount of the organic binder added was 1 to 3 mass % with respect to the total mass of the carbide powder. After mixing these raw materials by a mixer, the mixture was subjected to a dispersion treatment by a ultrasonic homogenizer.

(2) A slurry thus obtained was applied on the graphite substrates (isotropic graphite having a thermal expansion coefficient of $4.5 \times 10^{-6}$/K and isotropic graphite having a thermal expansion coefficient of $6.5 \times 10^{-6}$/K) and the PBN substrate by spin coating, spray coating or brush coating (a coating step). After coating, the solvent was dried at about 200 deg. C. (a drying step). Then, heating (sintering) treatment was applied to the substrates with dried coatings, thereby forming a carbide coating film on each substrate (a film-forming step). Sintering in the film-forming step was conducted under the conditions: using the inside of a high frequency heating furnace shown in FIG. 1, sintering atmosphere: argon atmosphere (80 kPa), sintering time (holding time at a maximum sintering temperature): one hour (a bonding step). Sintering temperature was 2,500 deg. C. for the graphite substrates and 2,100 deg. C. for the PBN substrate.

<Evaluation>

The carbide coating films formed on the respective substrates were checked with the naked eye and microscopically whether there were cracks or not. The results are also shown in Table 4. It was confirmed from specimen Nos. C1 to C9 in Table 4 that both spin coating and spray coating formed good tantalum carbide coating films on the graphite substrates or the PBN substrate. On the other hand, tantalum carbide coating films formed by brush coating the slurry had a number of cracks because of its great thickness. It was confirmed that when an appropriate amount of Co as a sintering additive was added, tantalum carbide coating films which were microscopically better (i.e., had smaller crack widths) were formed. Moreover, when the graphite substrates having a greater thermal expansion coefficient were used, even thick coating films tended to develop less cracks.

Example 5

Application Example 1 of High Temperature-Resistant Article

<Single Crystal Growth Experiment>

An experiment on SiC single crystal growth by a sublimation method was carried out by using a high temperature crucible (a high temperature-resistant article) in which a carbide coating film comprising TaC was formed on a graphite substrate. The tantalum carbide coating film was formed in a similar way to the abovementioned specimen No. 3 of Example 4. This tantalum carbide coating film was formed on the entire inner surfaces of a graphite lid and the graphite crucible except a seed crystal portion.

The graphite crucible having the carbide tantalum coating film was filled with SiC raw material powder, and SiC seed crystal was fixed on the graphite lid having the tantalum carbide film. As for crystal growth conditions, a seed crystal portion had a temperature of 2,200 deg. C. and a raw material portion had a temperature of 2,300 deg. C. The atmosphere was an argon atmosphere (1 kPa) and growth time was 24 hours. For comparison, a similar crystal growth experiment was carried out by using a graphite crucible having no tantalum carbide coating film.

<Evaluation>

In the case of the graphite crucible having the tantalum carbide coating film, as long as visible to the naked eye, the tantalum carbide coating film did not suffer damage such as peeling off even after SiC growth, and maintained a very good state. On the other hand, in the case of the graphite crucible having no tantalum carbide coating film, a graphite surface of the graphite crucible was very rough because it was terribly worn away by sublimated SiC gas.

In addition, grown crystal formed in each case was cut and polished, and a cross section thereof was observed by a microscope. In the case of using the graphite crucible having no tantalum carbide coating film, it was observed that a number of amorphous graphite particles were mixed in the grown crystal. On the other hand, in the case of using the graphite crucible having the tantalum carbide coating film, such a tramp material was not observed in the grown crystal, and it was confirmed that crystal of a higher quality was obtained.

Example 6

Application Example 2 of High Temperature-Resistant Article

<Single Crystal Growth Experiment>

An experiment on AlN single crystal growth by a sublimation method was carried out by using a tantalum carbide flat plate as a lid of a high temperature crucible. The tantalum carbide flat plate was a disk-shaped bulk material (80 mm in diameter×0.8 mm in thickness), which was obtained as specimen No. 1 of Example 1.

AlN seed crystal was fixed by bonding to the tantalum carbide lid comprising the tantalum carbide flat plate. For bonding, the adhesive of specimen No. A11 of Example 3 was used. A tantalum crucible having a carbide layer which was formed by carburizing a surface of tantalum was filled with AlN powder as a raw material. As for crystal growth conditions, a seed crystal portion had a temperature of 2,200 deg. C. and a raw material portion had a temperature of 2,300 deg. C. The atmosphere was an argon atmosphere (80 kPa), and growth time was 24 hours. For comparison, a similar crystal growth experiment was also carried out by using, as a lid, a tantalum disk (80 mm in diameter×0.8 mm in thickness) having a carbide layer.

<Evaluation>

When the lid comprising the tantalum carbide flat plate was used, there was no big change in appearance and shape (flatness) of the lid between before and after AlN crystal growth. On the other hand, when the tantalum lid having the carbide layer was used, the lid was warped greatly and developed cracks after AlN crystal growth. Moreover, because of the warpage, AlN seed crystal dropped during growth and as a result not single crystal but polycrystal grew on the lid.

Example 7

Application Example 3 of High Temperature-Resistant Article

<Production of Heater>

A graphite heater having a carbide coating film on a surface thereof will be described. A carbide coating film (a tantalum carbide coating) similar to specimen No. 3 of Example 4 was formed on a surface of a rod-like graphite heater. However, heating for sintering was not high frequency heating but self heating of the graphite heater.

<Evaluation>

Durability of the thus obtained graphite heater coated with tantalum, carbide was evaluated. Specifically, the heater was heated at a temperature of 1,500 deg. C. in a nitrogen and ammonia atmosphere (nitrogen 90%, ammonia 10%, 100 kPa) for 10 hours. For comparison, a similar heating test was performed by using a graphite heater which was not coated with tantalum carbide.

Since the graphite heater coated with tantalum carbide had no big change in appearance and shape between before and after the above heating test, it is apparent that the graphite heater coated with tantalum carbide showed very high durability. On the other hand, a surface of the graphite heater which was not coated with tantalum carbide was terribly worn away.

TABLE 1

| SPECIMEN NO. | MATERIAL OF SHIELDING MEMBER (UPPER SIDE/ LOWER SIDE) | PROCESSING BEFORE SINTERING | TaC POWDER PARTICLE DIAMETER (μm) | SINTERING ADDITIVE CONCENTRATION (at. %) | ORGANIC BINDER CONCENTRATION (mass %) | PLASTICIZER CONCENTRATION (mass %) | SINTERING TEMP. (deg. C.) |
|---|---|---|---|---|---|---|---|
| 1 | GRAPHITE PLATE/ GRAPHITE PLATE | NONE | 2 | 0 | 0.5 | 0.5 | 2,500 |
| 2 | NONE/ GRAPHITE PLATE | NONE | 2 | 0 | 0.5 | 0.5 | 2,500 |
| 3 | GRAPHITE POWDER/ GRAPHITE PLATE | NONE | 2 | 0 | 0.5 | 0.5 | 2,500 |
| 4 | GRAPHITE POWDER/ GRAPHITE POWDER | NONE | 2 | 0 | 0.5 | 0.5 | 2,500 |
| 5 | GRAPHITE PLATE/ | A THROUGH HOLE | 2 | 0 | 0.5 | 0.5 | 2,500 |
| 6 | GRAPHITE PLATE | NONE | 0.1 | 0 | 0.5 | 0.5 | 2,500 |
| 7 | | NONE | 10 | 0 | 0.5 | 0.5 | 2,500 |
| 8 | | NONE | 2 | 1 | 0.5 | 0.5 | 2,500 |
| 9 | | NONE | 2 | 5 | 0.5 | 0.5 | 2,500 |
| 10 | | NONE | 2 | 0 | 0 | 0 | — |
| 11 | | NONE | 2 | 0 | 0.25 | 0.25 | 2,500 |
| 12 | | NONE | 2 | 0 | 3 | 3 | — |
| 13 | | NONE | 2 | 0 | 3 | 0.5 | 2,500 |
| 14 | | NONE | 2 | 0 | 0.5 | 0 | 2,500 |
| 15 | | NONE | 2 | 0 | 0.5 | 0.5 | 1,900 |
| 16 | | NONE | 2 | 0 | 0.5 | 0.5 | 2,000 |
| 17 | | NONE | 2 | 0 | 0.5 | 0.5 | 2,800 |
| 18 | | NONE | 2 | 0 | 0.5 | 0.5 | 2,900 |

TABLE 2

| SPECIMEN NO. | COMPACT FORMABILITY *1 | SINTERED BODY SHAPE RETAINABILITY *2 | DENSITY *3 | SURFACE ROUGHNESS *4 | IMPURITY CONCENTRATION *5 | TOTAL EVALUATION *6 |
|---|---|---|---|---|---|---|
| 1 | very good | very good | good | very good | very good | good |
| 2 | very good | fair | good | very good | very good | fair |
| 3 | very good | fair | good | not good | very good | not good |
| 4 | very good | fair | good | not good | very good | not good |
| 5 | very good | very good | good | very good | very good | good |
| 6 | very good | fair | very good | very good | very good | fair |
| 7 | very good | very good | fair | very good | very good | fair |
| 8 | very good | very good | very good | very good | very good | very good |
| 9 | very good | very good | very good | very good | fair | fair |
| 10 | not good | — | — | — | — | not good |
| 11 | good | very good | good | very good | very good | good |
| 12 | not good | — | — | — | — | not good |
| 13 | very good | fair | fair | very good | very good | fair |
| 14 | fair | very good | good | very good | very good | fair |
| 15 | very good | very good | fair | very good | very good | fair |
| 16 | very good | very good | good | very good | very good | good |

TABLE 2-continued

| | SINTERED BODY | | | | | |
|---|---|---|---|---|---|---|
| SPECIMEN NO. | COMPACT FORMABILITY *1 | SHAPE RETAINABILITY *2 | DENSITY *3 | SURFACE ROUGHNESS *4 | IMPURITY CONCENTRATION *5 | TOTAL EVALUATION *6 |
| 17 | very good | good | good | very good | very good | good |
| 18 | very good | not good | very good | very good | very good | not good |

*1 very good: formable, good: formable but liable to crack, fair: compact cracked, not good: not formable
*2 very good: curvature radius of the sintered flat plate: 5 mm or more good: curvature radius of the sintered flat plate: not less than 1 mm and less than 5 mm fair: curvature radius of the sintered flat plate: less than 1 mm, not good: sintered flat plate cracked
*3 very good: not less than 95% of ideal density, good: 90 to 95% of ideal density, fair: 85 to 90% of ideal density, not good: less than 85% of ideal density
*4 very good: smooth surface to the naked eye, not good: rough surface to the naked eye
*5 According to X-ray fluorescence analysis, very good: metal impurity (except Ta) concentration: less than 0.1 at. % good: metal impurity (except Ta) concentration: 0.1 to 0.2 at. %, fair: metal impurity concentration: 0.2 to 0.5 at. % not good: metal impurity concentration: 0.5 at. % or more
*6 The worst evaluation of all was used as total evaluation. very good: no problem, good: permissible, fair: insufficient, not good: unsatisfactory

TABLE 3

| | BONDING CONDITION | | | TENSILE TEST RESULT *1 | |
|---|---|---|---|---|---|
| SPECIMEN NO. | FIRST SUBSTRATE | SECOND SUBSTRATE | MAIN COMPONENT OF ADHESIVE | 1st TREATMENT (1,700 deg. C.) | 2nd TREATMENT (2,100 deg. C.) |
| A1 | GRAPHITE | GRAPHITE | TaC | good | good |
| A2 | GRAPHITE | SiC | TaC | good | good |
| A3 | GRAPHITE | TaC | TaC | good | good |
| A4 | GRAPHITE | W | WC | good | good |
| A5 | GRAPHITE | BN | TaC | good | good |
| A6 | GRAPHITE | AlN | TaC | good | good |
| A7 | SiC | TaC | TaC | good | good |
| A8 | SiC | AlN | TaC | good | good |
| A9 | SiC | W | WC | good | good |
| A10 | SiC | BN | TaC | good | good |
| A11 | TaC | AlN | TaC | good | good |
| A12 | TaC | W | TaC, WC | good | good |
| A13 | TaC | BN | TaC | good | good |
| A14 | W | BN | WC | good | good |
| A15 | W | AlN | TaC, WC | good | good |
| A16 | BN | AlN | TaC | good | good |
| B1 | GRAPHITE | GRAPHITE | GRAPHITE-based | good | good |
| B2 | GRAPHITE | SiC | GRAPHITE-based | good | good |
| B3 | GRAPHITE | TaC | GRAPHITE-based | fair | not good |
| B4 | GRAPHITE | W | GRAPHITE-based | fair | fair |
| B5 | GRAPHITE | BN | GRAPHITE-based | good | fair |
| | | | BN-based | fair | not good |
| B6 | GRAPHITE | AlN | GRAPHITE-based | not good | not good |
| | | | AlN-based | not good | not good |
| B7 | SiC | TaC | GRAPHITE-based | not good | not good |
| | | | AlN-based | fair | not good |
| B8 | SiC | AlN | AlN-based | fair | not good |
| B9 | SiC | W | GRAPHITE-based | fair | fair |
| | | | AlN-based | fair | not good |
| B10 | SiC | BN | BN-based | fair | not good |
| | | | AlN-based | fair | not good |
| B11 | TaC | AlN | AlN-based | fair | not good |
| B12 | TaC | W | GRAPHITE-based | not good | not good |
| | | | AlN-based | fair | not good |
| B13 | TaC | BN | BN-based | not good | not good |
| B14 | W | BN | BN-based | fair | not good |
| B15 | W | AlN | AlN-based | fair | not good |
| B16 | BN | AlN | BN-based | fair | not good |
| | | | AlN-based | fair | not good |

*1 good: tensile strength of the joint: 0.1 kgf/cm² or more fair: tensile strength of the joint: less than 0.1 kgf/cm², not good: non adherence
*2 Sample Nos. B1 to B16 were commercially available adhesives.

TABLE 4

| | FILM-FORMING METHOD | | | | EVALUATION | | |
|---|---|---|---|---|---|---|---|
| SPECIMEN NO. | SUBSTRATE MATERIAL | COATING METHOD | COATING THICKNESS (μm) | SINTERING ADDITIVE Co CONCENTRATION (at. %) | VISUAL CHECK OF CRACKS *1 | MICROSCOPIC CHECK OF CRACK WIDTH *2 | TOTAL EVALUATION *3 |
| C1 | GRAPHITE (thermal expansion coefficient: | SPIN COATING | 10 | 0 | very good | good | good |
| C2 | | SPIN COATING | 10 | 1 | very good | very good | very good |

TABLE 4-continued

| | | FILM-FORMING METHOD | | | EVALUATION | | |
|---|---|---|---|---|---|---|---|
| SPECIMEN NO. | SUBSTRATE MATERIAL | COATING METHOD | COATING THICKNESS (μm) | SINTERING ADDITIVE Co CONCENTRATION (at. %) | VISUAL CHECK OF CRACKS *1 | MICROSCOPIC CHECK OF CRACK WIDTH *2 | TOTAL EVALUATION *3 |
| C3 | 4.5 × 10⁻⁶/K) | SPRAY COATING | 5-20 | 1 | very good | very good | very good |
| C4 | PBN | SPIN COATING | 10 | 1 | very good | very good | very good |
| C5 | GRAPHITE (thermal | BRUSH COATING | 50-100 | 0 | not good | not good | not good |
| C6 | expansion coefficient: 4.5 × 10⁻⁶/K) | BRUSH COATING | 50-100 | 1 | not good | not good | not good |
| C7 | GRAPHITE (thermal | SPRAY COATING | 100 | 1 | very good | very good | very good |
| C8 | expansion coefficient: | SPRAY COATING | 100 | 1 | very good | very good | very good |
| C9 | 6.5 × 10⁻⁶/K) | SPRAY COATING | 200 | 1 | very good *4 | very good | vary good *4 |

*1 very good: No cracks were observed. not good: Cracks were observed.
*2 very good: Only submicrocracks were observed (crack width: less than 1 μm). good: Microcracks were observed (crack width: not less than 1 μm and less than 5 μm). not good: Macrocracks were observed (crack width: not less than 10 μm).
*3 The worst evaluation of all was used as total evaluation. very good: no problem, good: permissible, fair: insufficient, not good: unsatisfactory
*4 rough surface

What is claimed is:

1. A method for producing an article, comprising:
a coating step of coating a slurry comprising a powder of at least one carbide selected from the group consisting of niobium carbide, hafnium carbide, tantalum carbide, and tungsten carbide on a surface of a substrate;
a drying step of drying the substrate after the coating step; and
a film-forming step of heating the substrate after the drying step to form a carbide coating film on the surface of the substrate by sintering at a temperature of 2,000 to 2,800° C.,
thereby obtaining an article having the carbide coating film, wherein
the article and the substrate are resistant to melting at temperatures of at least 2,000° C., and
the average particle diameter of the powder is 0.2 to 5 μm.

2. The method for producing an article according to claim 1, wherein the slurry contains additive powder comprising a carbide of a transition metal or a transition metal having a melting point of not more than the sintering temperature in the film-forming step.

3. The method for producing an article according to claim 2, wherein the transition metal is one selected from the group consisting of Ti, Cr, Fe, Co and Ni.

4. The method for producing an article according to claim 1, wherein the slurry contains an organic binder.

5. The method for producing an article according to claim 1, wherein the substrate is a graphite substrate or a boron nitride substrate.

6. The method for producing an article according to claim 1, wherein the coating step is a spraying coating step of spraying the slurry onto the surface of the substrate or a spin coating step of pouring the slurry on the surface of the substrate spinning.

7. The method for producing an article according to claim 1, wherein the carbide coating film has a thickness of 5 to 30 μm.

8. The method for producing an article according to claim 1, wherein
the substrate is a graphite substrate having a thermal expansion coefficient of 5.5 to 8.8×10⁻⁶/K, and
the slurry is a tantalum carbide slurry comprising carbide powder containing tantalum carbide as a main component, and
the carbide coating film has a thickness of 30 to 200 μm.

* * * * *